(12) United States Patent
Sato (10) Patent No.: US 9,329,498 B2
(45) Date of Patent: May 3, 2016

(54) EXPOSURE APPARATUS AND METHOD OF MANUFACTURING ARTICLE

(71) Applicant: CANON KABUSHIKI KAISHA, Tokyo (JP)

(72) Inventor: Hiroshi Sato, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 219 days.

(21) Appl. No.: 14/260,443

(22) Filed: Apr. 24, 2014

(65) Prior Publication Data

US 2014/0340661 A1    Nov. 20, 2014

(30) Foreign Application Priority Data

May 16, 2013  (JP) .................................. 2013-104514

(51) Int. Cl.
*G03B 27/52*    (2006.01)
*G03F 7/20*     (2006.01)

(52) U.S. Cl.
CPC ........ *G03F 7/70775* (2013.01); *G03F 7/70633* (2013.01)

(58) Field of Classification Search
CPC .................... G03F 7/70633; G03F 7/70775
USPC ....................................... 355/55, 53
See application file for complete search history.

(56) References Cited

U.S. PATENT DOCUMENTS

2014/0240687 A1*  8/2014  Sato .................... G03F 7/70641
                                                      355/74

FOREIGN PATENT DOCUMENTS

JP        2011-238707 A    11/2011

* cited by examiner

*Primary Examiner* — Peter B Kim
(74) *Attorney, Agent, or Firm* — Rossi, Kimms & McDowell LLP (57) ABSTRACT

The present invention provides an exposure apparatus which exposes a substrate, comprising a substrate stage configured to be movable while holding the substrate, a measurement unit configured to measure a height of the substrate by irradiating the substrate with light and detecting the light reflected by the substrate, and a control unit configured to control the measurement unit, wherein the control unit obtains a velocity profile of the substrate stage and decides, based on the velocity profile, a plurality of timings to perform measurement by the measurement unit to equally space a plurality of measurement portions on the substrate measured by the measurement unit in a state in which an acceleration of the substrate stage is nonzero.

9 Claims, 10 Drawing Sheets

EXPOSURE APPARATUS AND METHOD OF MANUFACTURING ARTICLE

BACKGROUND OF THE INVENTION

1. Field of the Invention

The present invention relates to an exposure apparatus and a method of manufacturing an article.

2. Description of the Related Art

One of apparatuses used in a manufacturing step (lithography step) for a semiconductor device or the like is an exposure apparatus which transfers the pattern of a mask onto a substrate coated with a resist. Recent micropatterning of semiconductor devices and the like requests the exposure apparatus to accurately transfer, onto a substrate, a pattern formed on a mask. For this purpose, it is important to make the imaging plane (focus plane) of the projection optical system coincide with the substrate surface. The exposure apparatus therefore performs focus measurement to measure the height of the substrate surface.

In the exposure apparatus, focus measurement is generally performed while moving a substrate at a constant velocity. However, to increase the productivity (throughput), the exposure apparatus needs to perform focus measurement even in a state in which the acceleration of a substrate stage holding a substrate is nonzero, that is, a state in which the substrate stage is accelerated or decelerated. Japanese Patent Laid-Open No. 2011-238707 discloses a method of performing focus measurement in a state in which the substrate stage is accelerated or decelerated, and correcting the result based on a correction value obtained in advance.

Generally in the exposure apparatus, a plurality of timings to perform focus measurement are set at equal intervals. However, when an exposure apparatus configured to perform focus measurement at a plurality of timings set at equal intervals performs focus measurement in the state in which the substrate stage is accelerated or decelerated, a plurality of measurement portions on a substrate to undergo focus measurement are not equally spaced.

SUMMARY OF THE INVENTION

The present invention provides a technique advantageous for performing focus measurement on a substrate in an exposure apparatus.

According to one aspect of the present invention, there is provided an exposure apparatus which exposes a substrate, comprising a substrate stage configured to be movable while holding the substrate; a measurement unit configured to measure a height of the substrate by irradiating the substrate with light and detecting the light reflected by the substrate; and a control unit configured to control the measurement unit, wherein the control unit obtains a velocity profile of the substrate stage and decides, based on the velocity profile, a plurality of timings to perform measurement by the measurement unit to equally space a plurality of measurement portions on the substrate measured by the measurement unit in a state in which an acceleration of the substrate stage is nonzero.

Further features of the present invention will become apparent from the following description of exemplary embodiments with reference to the attached drawings.

DESCRIPTION OF THE EMBODIMENTS

Exemplary embodiments of the present invention will be described below with reference to the accompanying drawings. Note that the same reference numerals denote the same members throughout the drawings, and a repetitive description thereof will not be given.

First Embodiment

Figure 1:
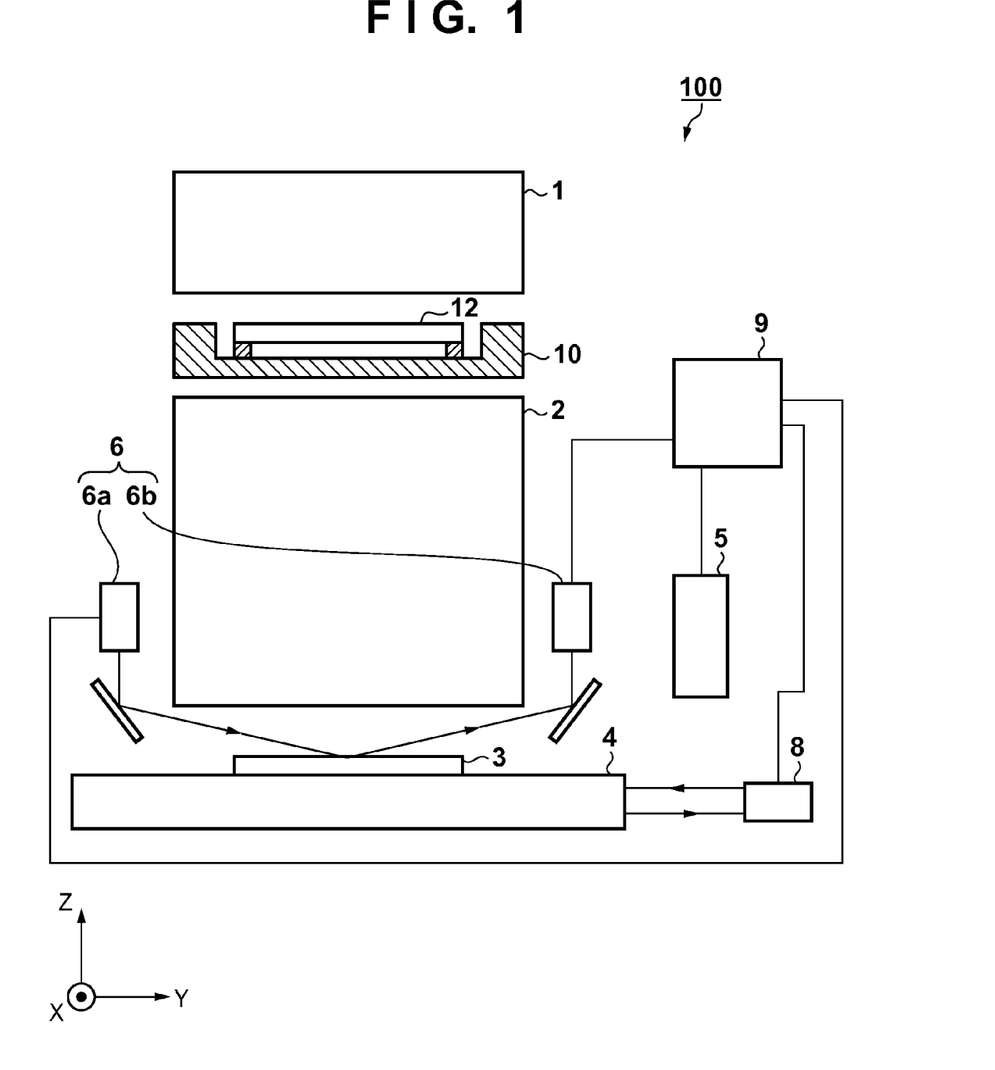
FIG. 1 is a schematic view showing an exposure apparatus according to the first embodiment.

An exposure apparatus 100 according to the first embodiment of the present invention will be described with reference to FIG. 1. FIG. 1 is a schematic view showing the exposure apparatus 100 according to the first embodiment. The exposure apparatus 100 according to the first embodiment is a scanning exposure apparatus which transfers the pattern of an original 12 (mask) by slit light to respective shot regions on a substrate 3 (for example, wafer) via a projection optical system 2 while scanning the original 12 and the substrate relatively in the Y direction. The exposure apparatus 100 according to the first embodiment includes, for example, an illumination optical system 1, the projection optical system 2, an original stage 10, a substrate stage 4, an alignment detection unit 5, a focus measurement unit 6, and a position measurement unit 8. The exposure apparatus 100 also includes a control unit 9 which includes a CPU and memory and controls processing of exposing the substrate 3 (controls each unit of the exposure apparatus 100).

The illumination optical system 1 includes members such as an optical system configured to shape light emitted by a light source, an optical integrator, a masking blade, a collimator lens, and a mirror. The optical system configured to shape light forms the sectional shape (including dimensions) of light emitted by the light source into a desired shape. The optical integrator uniforms the light distribution characteristic of a beam so that the original 12 can be illuminated at a uniform illuminance. The illumination optical system 1 shapes, by the masking blade, slit light having, for example, a band shape long in the X direction or an arcuate shape, and illuminates part of the original 12 with the slit light. Part of the original 12 that is illuminated with the slit light will be referred to as an illuminated region.

The original 12 and substrate 3 are held by the original stage 10 and substrate stage 4, respectively, and are arranged at almost optically conjugate positions (the object plane and imaging plane of the projection optical system 2) via the projection optical system 2. The original stage 10 and substrate stage 4 are configured to be movable. The projection optical system 2 has a predetermined projection magnification (for example, ½), and reduces an illuminated region on a mask to project the reduced illuminated region onto a substrate. A region (region irradiated with slit light) on the substrate where the illuminated region on the mask is reduced and projected will be referred to as an exposure region. The original stage 10 and substrate stage 4 move at a velocity ratio corresponding to the projection magnification of the projection optical system 2 in synchronism with each other in a direction (Y direction in the first embodiment) perpendicular to the optical axis direction (Z direction) of the projection optical system 2. Hence, slit light can be scanned in the Y direction on the substrate to transfer a pattern formed on the original 12 to a shot region on the substrate. By sequentially repeating this scanning exposure for respective shot regions on the substrate while moving the substrate stage 4 step by step, exposure processing on one substrate 3 can be completed.

The position measurement unit 8 includes, for example, a laser interferometer and measures the position of the substrate stage 4. For example, the laser interferometer emits a laser beam toward the reflecting plate (not shown) of the substrate stage 4, and detects a displacement from a reference position on the substrate stage 4 based on the laser beam reflected by the reflecting plate. The position measurement unit 8 can therefore obtain the current position of the substrate stage 4 based on the displacement. In the first embodiment, the position of the substrate stage 4 is obtained by the laser interferometer using a laser beam. However, the present invention is not limited to this, and the position of the substrate stage 4 may be obtained by, for example, an encoder.

To align the pattern of the original 12 and each shot region at high accuracy, the alignment detection unit 5 measures the positions of respective alignment marks formed on the substrate. The alignment detection unit 5 includes, for example, a light source, illumination system, imaging optical system, and sensor. The light source emits light having a wavelength different from the wavelength of light used to expose the substrate 3, that is, emits non-exposure light not to expose the substrate 3 (not to sensitize the resist on the substrate). The alignment detection unit 5 irradiates an alignment mark formed on the substrate via the illumination system with light emitted by the light source, and forms the image of the alignment mark irradiated with the light on a sensor via the imaging optical system. The sensor outputs information representing, for example, a position on the sensor at which the image of the alignment mark is formed. Based on an output from the sensor, the alignment detection unit 5 can measure the position of the alignment mark. Based on the position of each alignment mark measured by the alignment detection unit 5, the control unit 9 performs scanning exposure of the substrate 3 while controlling the scanning speeds of the original stage 10 and substrate stage 4 and the projection magnification of the projection optical system 2. As a result, the pattern formed on the original 12 can be transferred to each shot region on the substrate at high accuracy.

Figure 2:
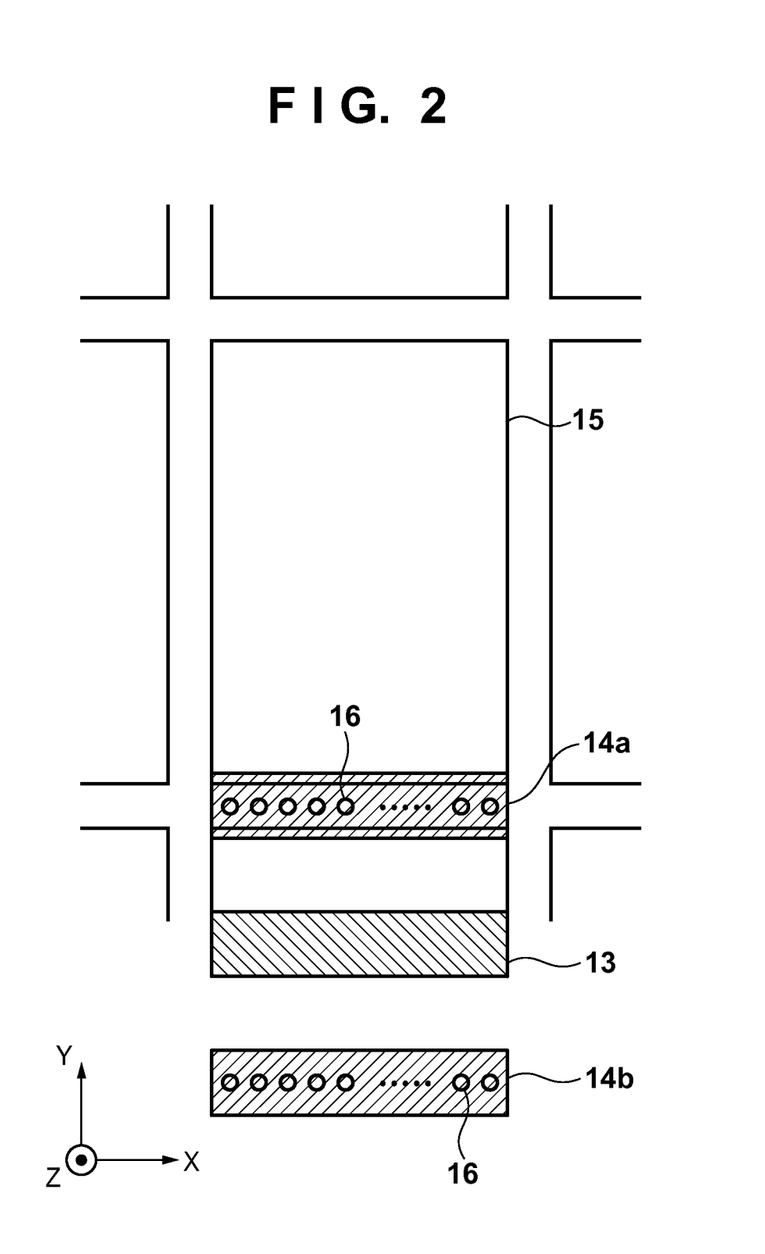
FIG. 2 is a view showing the position of the measurement region of a focus measurement unit.

To make the substrate surface coincide with the imaging plane (focus plane) of the projection optical system 2, in a state in which the substrate stage 4 moves, the focus measurement unit 6 measures the height of the substrate 3 prior to a region where the substrate 3 is irradiated with slit light. The focus measurement unit 6 according to the first embodiment is of an oblique incidence type in which the substrate 3 is irradiated with light obliquely. The focus measurement unit 6 includes an irradiation unit 6a which irradiates the substrate 3 with light, and a light receiving unit 6b which receives light reflected by the substrate 3. The irradiation unit 6a includes a light source, projection mark, and optical system. The irradiation unit 6a irradiates a projection mark with light emitted by the light source, and images the projection mark on the substrate via the optical system. The light receiving unit 6b includes an imaging optical system and sensor. The light receiving unit 6b forms, on the sensor via the imaging optical system, the image of the projection mark reflected by the substrate 3. The sensor outputs information representing, for example, a position on the sensor at which the image of the projection mark is formed. Since the focus measurement unit 6 obliquely images the projection mark on the substrate 3, a change of the height of the substrate 3 serves as a change of the imaging position on the sensor. The height of the substrate 3 can therefore be measured based on an output from the sensor (information representing an imaging position on the sensor). As shown in FIG. 2, the focus measurement unit 6 measures the height of the substrate surface at a plurality of measurement points 16 arrayed in the X direction in measurement regions 14a and 14b. The measurement regions 14a and 14b are arranged in the scanning direction of an exposure region 13 to be exposed with slit light (moving direction (±Y directions) of the substrate stage 4). With this arrangement, the focus measurement unit 6 can measure the height of the substrate 3 prior to a region where the substrate 3 is irradiated with slit light, that is, parallel with exposure processing in the exposure apparatus 100 in the state in which the substrate stage 4 moves, as described above.

Figure 3:
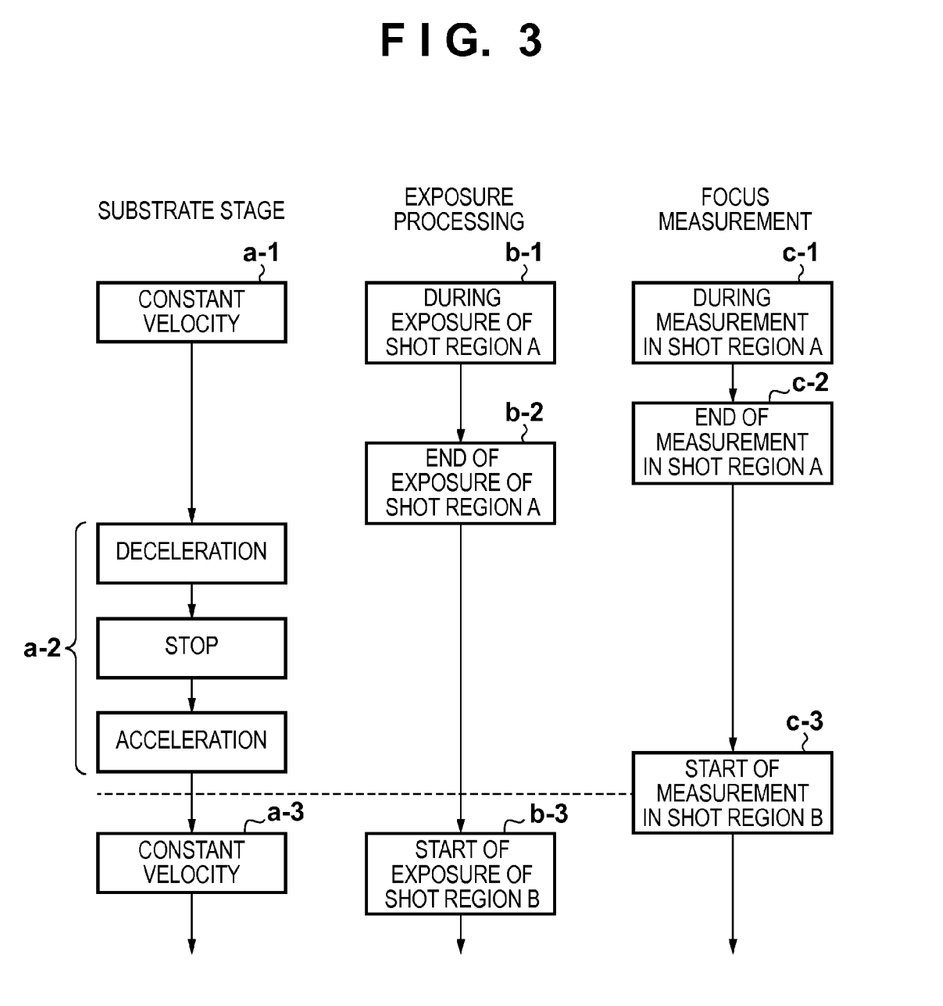
FIG. 3 is a conceptual view showing, in time-series, movement of a substrate stage, exposure processing, and measurement by the focus measurement unit.
Figure 4:
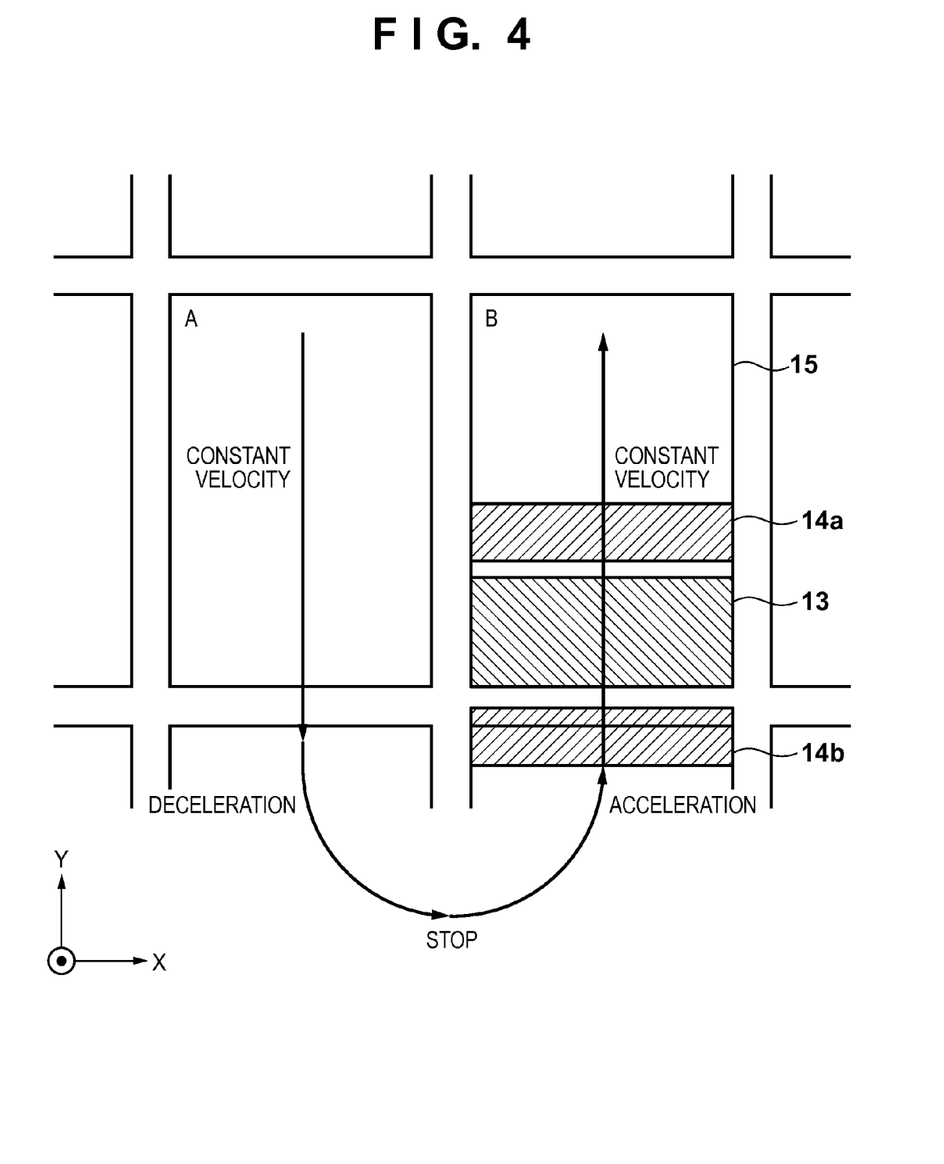
FIG. 4 is a view for explaining movement of the substrate stage in exposure processing.

Movement of the substrate 3 (substrate stage 4) in exposure processing will be explained with reference to FIGS. 3 and 4. FIG. 3 is a conceptual view showing, in time-series, movement of the substrate stage 4, exposure processing, and measurement by the focus measurement unit 6. FIG. 4 is a view for explaining movement of the substrate stage 4 in exposure processing. FIG. 4 shows a center path in the exposure region 13. As described above, a plurality of shot regions 15 are formed on the substrate. The exposure apparatus 100 (control unit 9) exposes each shot region while moving the substrate stage 4.

For example, when a shot region A is exposed (b-1), that is, when the exposure region 13 exists in the shot region A, the control unit 9 moves the substrate stage 4 at a constant velocity so that the exposure region 13 scans the substrate in the −Y direction at a constant velocity (a-1). At this time, the focus measurement unit 6 measures in advance the height of the substrate 3 in the measurement region 14b (c-1), and ends the measurement when the measurement region 14b leaves the shot region A (c-2). When the exposure of the shot region A ends (b-2), that is, when the exposure region 13 leaves the shot region A, the control unit 9 decelerates and stops the substrate stage 4 in the −Y direction, and accelerates it in the +Y direction (a-2). At the same time, the control unit 9 moves the substrate stage 4 in the X direction to arrange the exposure region 13 in a shot region B to be exposed next. When the measurement region 14a reaches the shot region B, the focus measurement unit 6 starts measurement (c-3). When the exposure region 13 reaches the shot region B, exposure processing starts (b-3). When the exposure region 13 exists in the shot region B, the control unit 9 moves the substrate stage 4 at a constant velocity so that the exposure region 13 scans the substrate in the +Y direction at a constant velocity (a-3). In this manner, the control unit 9 moves the substrate stage 4 at a constant velocity when scanning the exposure region 13 in the respective shot regions A and B. When moving the exposure region 13 from the exposed shot region A to the shot region B to be exposed next, the control unit 9 accelerates or decelerates the substrate stage 4 in the ±Y directions. By this operation, the exposure apparatus 100 can expose the plurality of shot regions 15 on the substrate.

Focus measurement is generally performed while moving the substrate 3 (substrate stage 4) at a constant velocity. For example, a conventional exposure apparatus accelerates the substrate stage 4 until a measurement region 14 reaches the shot region 15, and moves the substrate stage 4 at a constant velocity when the measurement region 14 scans the shot region 15. If a plurality of timings to perform measurement by the focus measurement unit 6 are set at equal intervals, a plurality of measurement portions on the substrate measured by the focus measurement unit 6 can be equally spaced. However, the exposure apparatus is requested to increase the productivity (throughput). To meet this request, focus measurement is preferably performed even in a state in which the acceleration of the substrate stage 4 is nonzero, that is, a state in which the substrate stage 4 is accelerated or decelerated. For example, the control unit 9 accelerates the substrate stage 4 not until the measurement region 14 reaches the shot region 15, but until the exposure region 13 reaches the shot region 15. In this case, the focus measurement unit 6 performs measurement in the state in which the substrate stage 4 is accelerated until the exposure region 13 reaches the shot region 15. Thus, only by setting, at equal intervals, a plurality of timings to perform measurement by the focus measurement unit 6, a plurality of measurement portions measured by the focus measurement unit 6 cannot be equally spaced. If the plurality of measurement portions measured by the focus measurement unit 6 are not equally spaced, processing in the focus measurement unit 6 becomes complicated, and it may become difficult to increase the accuracy and processing speed of focus measurement. To solve this, in the exposure apparatus 100 according to the first embodiment, a plurality of timings to perform measurement by the focus measurement unit 6 are decided so that a plurality of measurement portions measured by the focus measurement unit 6 are equally spaced even in the state in which the substrate stage 4 is accelerated or decelerated.

Figure 5:
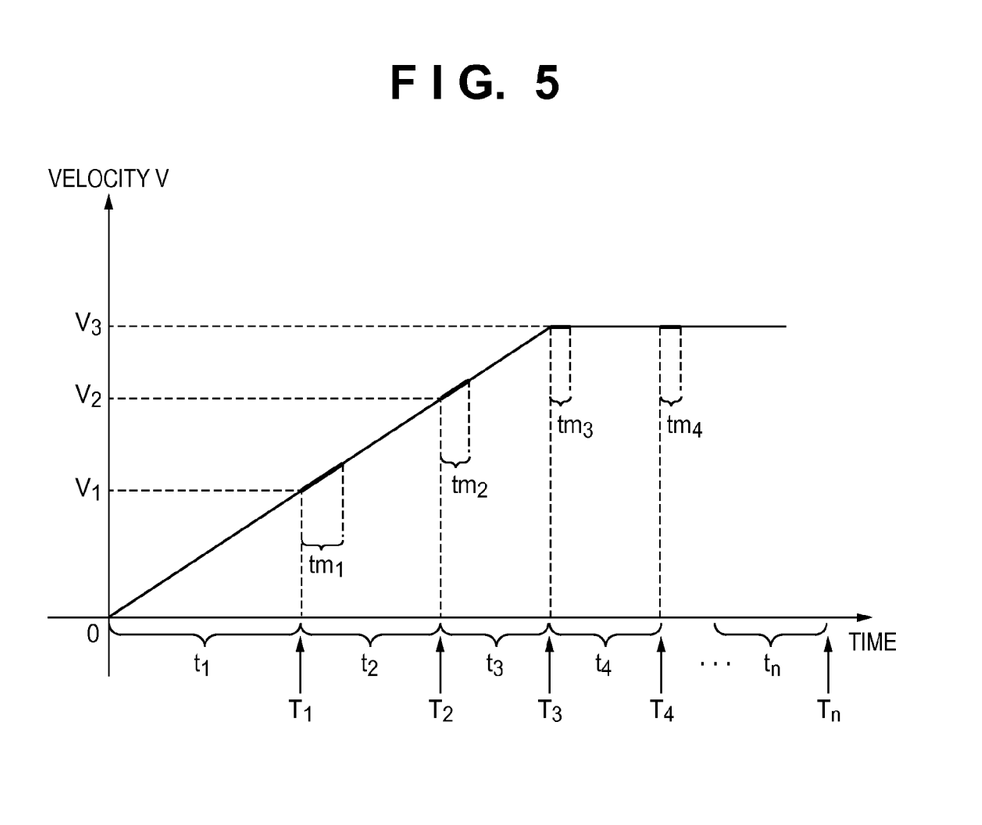
FIG. 5 is a graph showing the relationship (velocity profile) between the time and the velocity of the substrate stage.

The timing to measure the height at each measurement portion by the focus measurement unit 6 in the exposure apparatus 100 according to the first embodiment will be explained. FIG. 5 is a graph showing the relationship (velocity profile) between the time and the velocity of the substrate stage 4 in the Y direction when exposure processing is performed. In FIG. 5, time $T_n$ (n is a natural number) represents the timing (time) to perform measurement by the focus measurement unit 6, and a period $t_n$ (n is a natural number) represents the difference between the time $T_n$ and the time $T_{n-1}$, that is, the interval between timings to perform measurement by the focus measurement unit 6. In the first embodiment, the relationship between the time and the velocity of the substrate stage 4 as shown in FIG. 5 can be obtained in advance by the control unit 9 from an external computer or the like before measurement by the focus measurement unit 6. However, the present invention is not limited to this. For example, the control unit 9 may obtain in real time this relationship based on the result of measurement by the position measurement unit 8 during measurement by the focus measurement unit 6. As described above, in the exposure apparatus 100 according to the first embodiment, the focus measurement unit 6 measures each measurement portion in the state in which the substrate stage 4 is accelerated, until the exposure region 13 reaches the shot region 15. In FIG. 5, time $T_3$ is the time when the exposure region 13 reaches the shot region 15. The substrate stage 4 is accelerated before the time $T_3$, and moves at a constant velocity (velocity $V_3$) after the time $T_3$. In the exposure apparatus 100, the control unit 9 decides timings to perform measurement by the focus measurement unit 6 so that a plurality of measurement portions on the substrate are equally spaced even in the state (before the time $T_3$) in which the substrate stage 4 is accelerated.

For example, letting X be the interval between a plurality of measurement portions in the state in which the substrate stage 4 moves at an acceleration a, equation (1) is satisfied:

$$X = \frac{1}{2}at_n^2 + V_{n-1}t_n \qquad (1)$$

where $V_{n-1}$ is the velocity of the substrate stage 4 when measurement was performed at an immediately preceding measurement portion. At this time, by using equation (2) rewritten from equation (1), the control unit 9 calculates the interval (period $t_n$) between timings to perform measurement by the focus measurement unit 6, and adds the period $t_n$ to the time $T_{n-1}$ when an immediately preceding measurement portion was measured:

$$t_n = \frac{-V_{n-1} + \sqrt{V_{n-1}^2 + 2aX}}{a} \qquad (2)$$

Accordingly, the control unit 9 can set timings to perform measurement by the focus measurement unit 6 so that a plurality of measurement portions are equally spaced even in the state in which the substrate stage 4 is accelerated or decelerated (state in which the acceleration of the substrate stage 4 is nonzero).

For example, the control unit 9 decides the time $T_1$ to perform measurement by the focus measurement unit 6, as shown in FIG. 5. Then, by using equation (2), the control unit 9 calculates a period $t_2$ until the focus measurement unit 6 performs measurement next, so that measurement is performed at a portion spaced apart by an interval X from a measurement portion (to be referred to as the first measurement portion hereinafter) where measurement is performed at the time $T_1$. The control unit 9 adds the calculated period $t_2$ to the time $T_1$, deciding the time $T_2$ to perform measurement by the focus measurement unit 6. Similarly, by using equation (2), the control unit 9 calculates a period $t_3$ until the focus measurement unit 6 performs measurement next, so that measurement is performed at a portion spaced apart by the interval X from a measurement portion (to be referred to as the second measurement portion hereinafter) where measurement is performed at the time $T_2$. The control unit 9 adds the calculated period $t_3$ to the time $T_2$, deciding the time $T_3$ to perform measurement by the focus measurement unit 6. In this way, the control unit 9 sequentially decides the times $T_n$ to perform measurement by the focus measurement unit 6. When the focus measurement unit 6 performs measurement at the decided times $T_n$, a plurality of measurement portions measured by the focus measurement unit 6 can be equally spaced even in the state in which the substrate stage 4 is accelerated or decelerated. That is, the focus measurement unit 6 can perform measurement so that the distance between the first measurement portion and the second measurement portion, and the distance between the second measurement portion and the third measurement portion (portion where measurement is performed at the time $T_3$) become the interval X.

In contrast, letting X be the interval between a plurality of measurement portions in the state in which the substrate stage 4 moves at a constant velocity $V_n$, equation (3) is satisfied:

$$X = V_n \cdot t_n \quad (3)$$

At this time, by using equation (4) rewritten from equation (3), the control unit 9 calculates the interval (period $t_n$) between timings to perform measurement by the focus measurement unit 6, and adds the period $t_n$ to the time $T_{n-1}$ when an immediately preceding measurement portion was measured:

$$t_n = \frac{X}{V_n} \quad (4)$$

Thus, the control unit 9 decides the time $T_n$ to perform measurement by the focus measurement unit 6. When the focus measurement unit 6 performs measurement at the decided times $T_n$, a plurality of measurement portions measured by the focus measurement unit 6 can be equally spaced even in the state in which the substrate stage 4 moves at a constant velocity.

As described above, in the exposure apparatus 100 according to the first embodiment, the control unit 9 decides timings of measurement by the focus measurement unit 6 so that a plurality of measurement portions on the substrate are equally spaced even in the state in which the substrate stage 4 is accelerated or decelerated. The focus measurement unit 6 measures the height of the substrate 3 at the timings decided by the control unit 9. As a result, a plurality of measurement portions on the substrate measured by the focus measurement unit 6 can be equally spaced even in the state in which the substrate stage 4 moves at a constant velocity and the state in which the substrate stage 4 is accelerated or decelerated. The exposure apparatus 100 according to the first embodiment can increase the productivity (throughput) of the exposure apparatus 100 and suppress complication of focus measurement processing.

A method of performing measurement by the focus measurement unit 6 including the irradiation unit 6a and light receiving unit 6b at the timing decided by the control unit 9 will be explained. Examples of the method of performing measurement at the timing decided by the control unit 9 are a method of simultaneously operating the irradiation unit 6a and light receiving unit 6b at the decided timing, and a method of always operating one of the irradiation unit 6a and light receiving unit 6b and operating the other one at the decided timing. The former method has an advantage capable of reducing power consumption because the operations in the irradiation unit 6a and light receiving unit 6b can be minimized. However, simultaneously operating the irradiation unit 6a and light receiving unit 6b has a disadvantage of a high degree of difficulty in design. The latter method can be easily implemented because one of the irradiation unit 6a and light receiving unit 6b is only operated at the decided timing, but the power consumption becomes larger than that in the former method. The measurement method in the focus measurement unit is preferably selected in accordance with the arrangement and specifications of the exposure apparatus.

Second Embodiment

An exposure apparatus according to the second embodiment of the present invention will be described. In the exposure apparatus according to the second embodiment, a focus measurement unit 6 measures the height of a substrate 3 in a period at each of a plurality of timings decided by a control unit 9 to give a range to each of the plurality of measurement portions. The exposure apparatus according to the second embodiment has the same apparatus arrangement as that of the exposure apparatus 100 according to the first embodiment, so a description of the apparatus arrangement will not be repeated. In the exposure apparatus according to the second embodiment, the control unit 9 decides timings of measurement by the focus measurement unit 6 so that a plurality of measurement portions measured by the focus measurement unit 6 are equally spaced even in the state in which a substrate stage 4 is accelerated or decelerated.

The focus measurement unit 6 sets, as the measurement result of one measurement portion, the average value of the height in the range (to be referred to as a measurement range hereinafter) of one measurement portion so as to reduce a measurement error at each of a plurality of measurement portions. For this purpose, the focus measurement unit 6 measures the height of the substrate 3 in a period (to be referred to as a measurement period hereinafter) at each of a plurality of timings decided by the control unit 9 in the state in which the substrate stage 4 moves. For example, as shown in FIG. 5, measurement periods $t_{m1}$ to $t_{m4}$ are respectively added to the times $T_1$ to $T_4$ representing timings to perform measurement by the focus measurement unit 6. The focus measurement unit 6 performs measurement in the respective measurement periods $t_{m1}$ to $t_{m4}$. The focus measurement unit 6 can measure the height in the measurement range at each of a plurality of measurement portions and obtain the average value of the height in the measurement range of each measurement portion as the measurement result (height) of each measurement portion.

In this fashion, the measurement period is added to each of a plurality of timings, and the average value of the height in the measurement range is set as the measurement result of the measurement portion. This can reduce a measurement error at each of a plurality of measurement portions. To the contrary, to reduce variations (error) of measurement results between a plurality of measurement portions, the length (to be referred to as the length of the measurement range hereinafter) of the measurement range in the moving direction (Y direction) of the substrate stage 4 is preferably set to be constant at a plurality of measurement portions. That is, the measurement period at each of a plurality of timings is preferably decided so that the length of the measurement range at each of the plurality of measurement portions becomes a target value.

In the state in which the substrate stage 4 moves at a constant velocity, the length of the measurement range can be set to be constant at a plurality of measurement portions by equalizing the measurement periods at the respective timings. However, in the state in which the substrate stage 4 is accelerated or decelerated, if the measurement periods at the respective timings are equalized, the lengths of the measurement ranges differ from each other at a plurality of measurement portions. For example, in the state (after the time $T_3$) in which the substrate stage 4 moves at a constant velocity, if the measurement periods $t_{m3}$ and $t_{m4}$ are set to be equal, the length of the measurement range based on the measurement period $t_{m3}$ and that of the measurement range based on the measurement period $t_{m4}$ can become equal to each other, as shown in FIG. 5. To the contrary, in the state (before the time $T_3$) in which the substrate stage 4 is accelerated or decelerated, if the measurement periods $t_{m1}$ and $t_{m2}$ are set to be equal, the length of the measurement range based on the measurement period $t_{m1}$ and that of the measurement range based on the measurement period $t_{m2}$ differ from each other. To solve this problem, in the exposure apparatus according to the second embodiment, the control unit 9 decides measurement periods so that the length of the measurement range at each of a plurality of measurement portions becomes a target value even in the state in which the substrate stage 4 is accelerated or decelerated.

For example, letting L be the target value of the length of the measurement range in the state in which the substrate stage 4 moves at an acceleration a, the measurement period $t_m$ of the focus measurement unit 6 is given by:

$$t_m = \frac{-V_0 + \sqrt{V_0^2 + 2aL}}{a} \qquad (5)$$

where $V_0$ is the velocity of the substrate stage 4 when the focus measurement unit 6 starts measurement (time $T_n$). With this setting, even in the state in which the substrate stage 4 is accelerated or decelerated, the control unit 9 can decide measurement periods (for example, the measurement periods $t_{m1}$ and $t_{m2}$ shown in FIG. 5) so that the length of each measurement range becomes the target value. In contrast, letting L be the target value of the length of the measurement range in the state in which the substrate stage 4 moves at a constant velocity V, the measurement period $t_m$ of the focus measurement unit 6 is given by:

$$t_m = \frac{L}{V} \qquad (6)$$

As described above, in the exposure apparatus according to the second embodiment, the control unit 9 decides the measurement period so that the length of the measurement range becomes the target value even in the state in which the substrate stage 4 is accelerated or decelerated. With this setting, the exposure apparatus according to the second embodiment can reduce a measurement error at each of a plurality of measurement portions and in addition, can reduce variations (error) of measurement results between a plurality of measurement portions.

At this time, if the measurement period of the focus measurement unit 6 is changed at respective measurement portions, the irradiating dose (integrated light amount) of light emitted by the focus measurement unit 6 (an irradiation unit 6a) differs between the measurement ranges at the respective measurement portions. If the irradiating dose differs between the respective measurement ranges, the result of measurement by the focus measurement unit 6 varies (error) between the plurality of measurement portions. To prevent this, the intensity of light from the irradiation unit 6a of the focus measurement unit 6 is preferably changed in accordance with the measurement period decided by the control unit 9 so that the irradiating dose of light irradiating each measurement range falls within an allowable range. For example, when the measurement period of the focus measurement unit 6 is set to be long, the intensity of light from the irradiation unit 6a is decreased. When the measurement period of the focus measurement unit 6 is set to be short, the intensity of light from the irradiation unit 6a is increased. The intensity of light from the irradiation unit 6a is changed by, for example, modulating a current supplied to the light source of the irradiation unit 6a.

Third Embodiment

Figure 6:
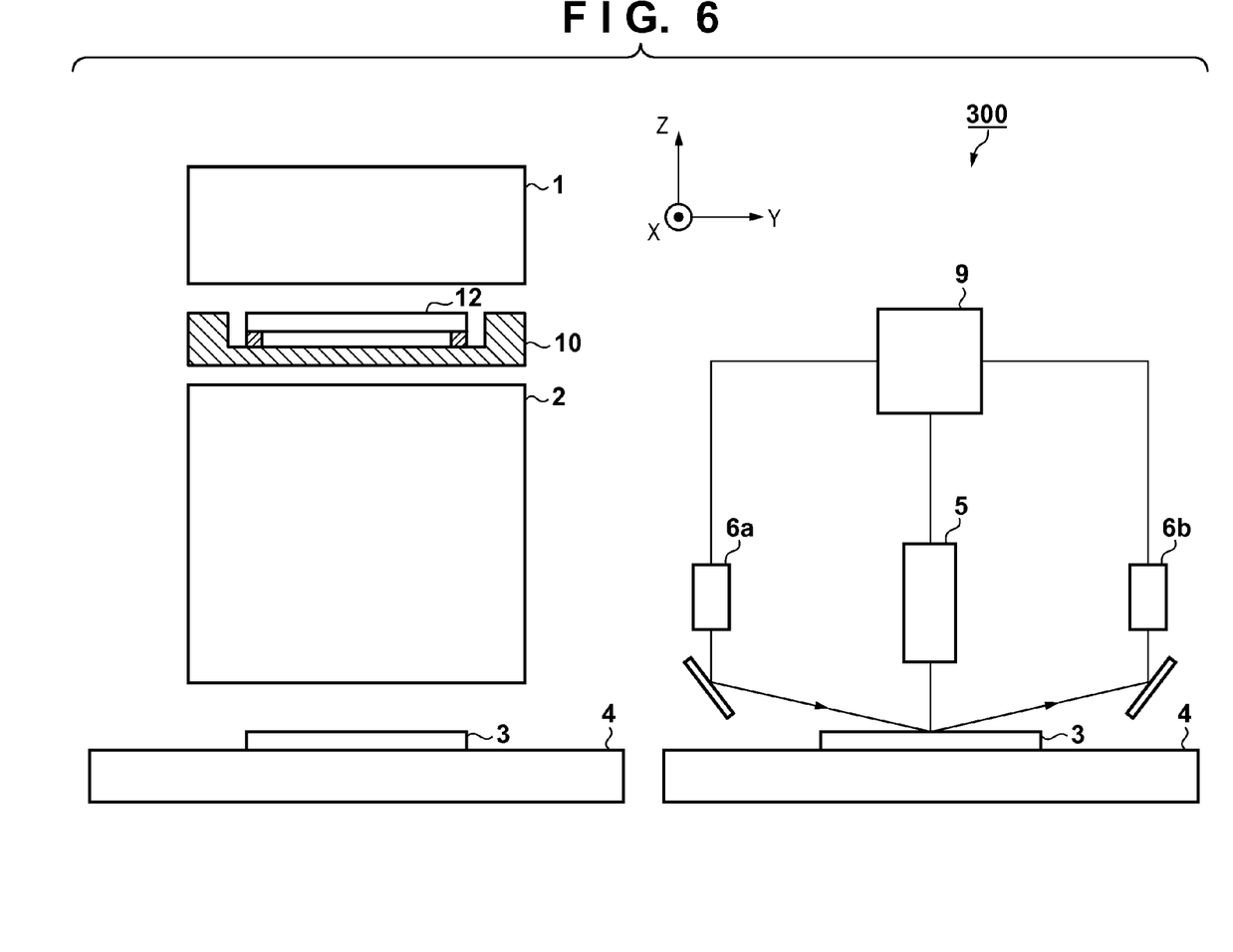
FIG. 6 is a schematic view showing an exposure apparatus according to the third embodiment.

An exposure apparatus 300 according to the third embodiment of the present invention will be described with reference to FIG. 6. FIG. 6 is a schematic view showing the exposure apparatus 300 according to the third embodiment. Unlike the exposure apparatus 100 according to the first embodiment, the exposure apparatus 300 according to the third embodiment is a so-called twin-stage exposure apparatus including a plurality of (two) substrate stages 4 for holding substrates 3. In the exposure apparatus 300, one of the two substrate stages 4 is arranged in the exposure area, and the other substrate stage 4 is arranged in the measurement area. In the exposure area, an illumination optical system 1, an original stage 10 for holding an original 12, and a projection optical system 2 are arranged, and scanning exposure of the substrate 3 is performed with slit light. In the measurement area, an alignment detection unit 5 and a focus measurement unit 6 (an irradiation unit 6a and light receiving unit 6b) are arranged, and alignment measurement by the alignment detection unit 5 and focus measurement by the focus measurement unit 6 are performed. The arrangement of each unit in the exposure apparatus 300 according to the third embodiment is the same as that of each unit in the exposure apparatus 100 according to the first embodiment, and a description thereof will not be repeated. Also, exposure processing to be performed in the exposure area is the same as exposure processing in the first embodiment. Hence, alignment measurement and focus measurement in the measurement area will be explained below.

Figure 7:
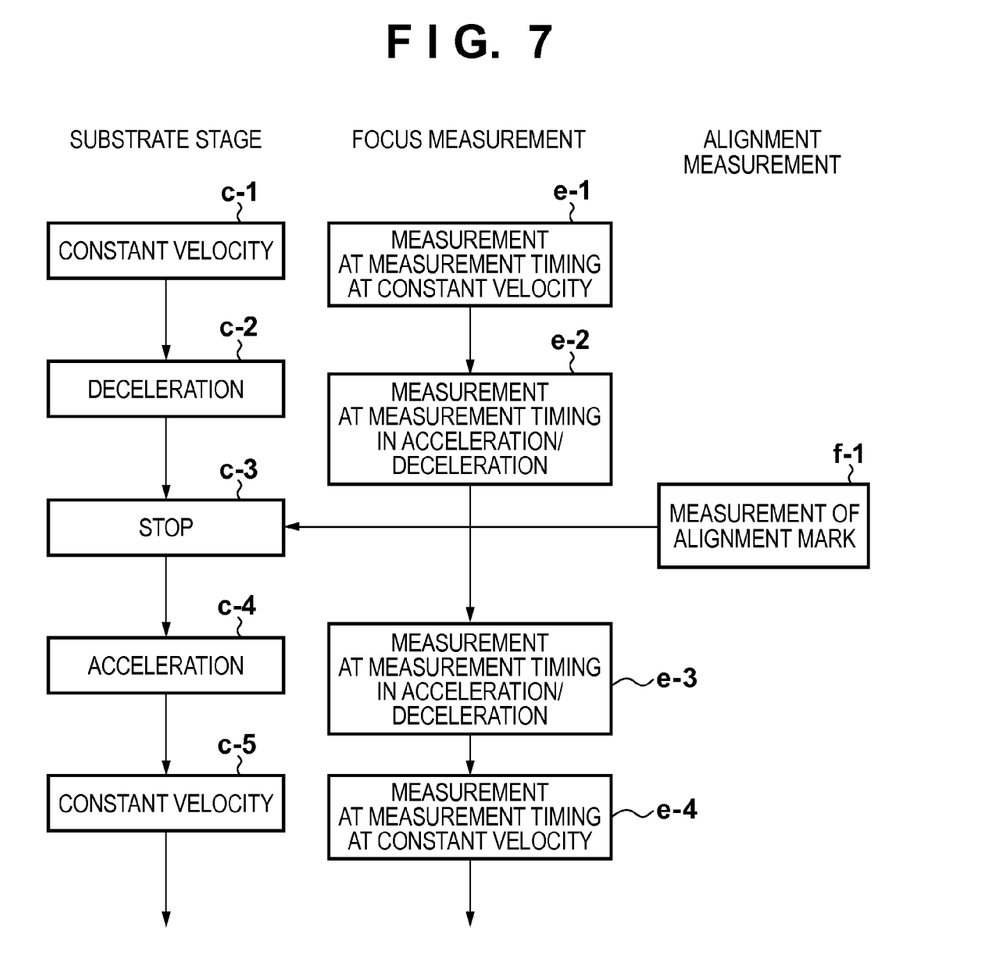
FIG. 7 is a conceptual view showing, in time-series, movement of a substrate stage, measurement by a focus measurement unit, and measurement by an alignment detection unit 5.
Figure 8:
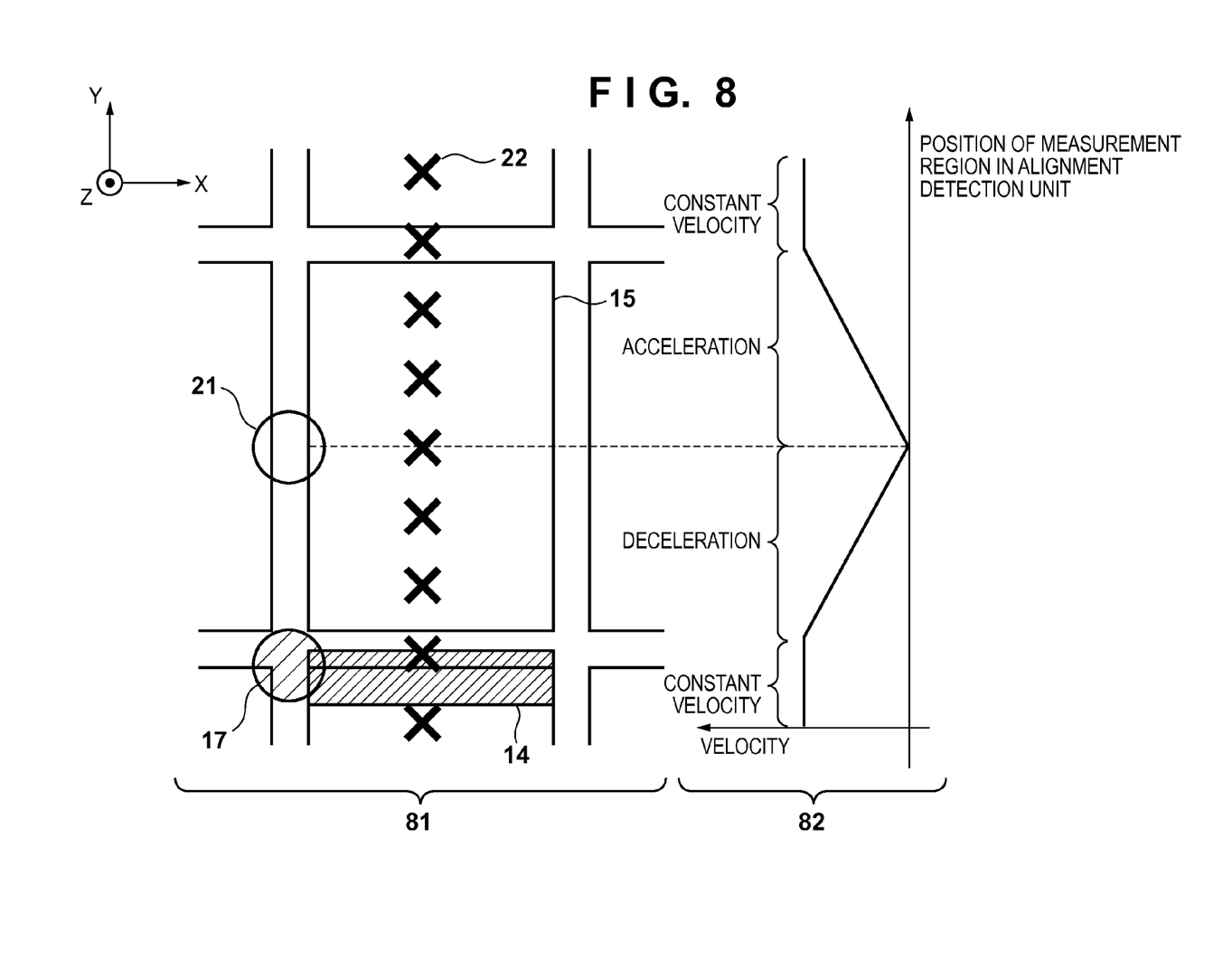
FIG. 8 is a view for explaining movement of the substrate stage in alignment measurement and focus measurement.

Alignment measurement and focus measurement in the measurement area will be described with reference to FIGS. 7 and 8. FIG. 7 is a conceptual view showing, in time-series, movement of the substrate stage 4, measurement by the focus measurement unit 6, and measurement by the alignment detection unit 5. FIG. 8 is a view for explaining movement of the substrate stage 4 in alignment measurement and focus measurement. In FIG. 8, 81 is a view showing the positional relationship between a shot region 15, an alignment mark 21, and a plurality of measurement portions 22. In FIG. 8, 81 shows a measurement region 17 in the alignment detection unit 5 and a measurement region 14 in the focus measurement unit. The surface of a substrate includes a plurality of alignment marks for measuring a position by the alignment detection unit 5, and a plurality of measurement portions for measuring a height by the focus measurement unit 6. In 81 of FIG. 8, one alignment mark 21 and a plurality of measurement portions 22 arrayed at equal intervals in the scanning direction (Y direction) are shown for descriptive convenience. In FIG. 8, 82 is a graph showing the relationship (velocity profile) between the position of the measurement region 17 in the alignment detection unit 5 and the velocity of the substrate stage 4 in the Y direction. The exposure apparatus 300 according to the third embodiment stops the substrate stage 4 in alignment measurement. Along with this, focus measurement is performed even in the state in which the substrate stage 4 is accelerated or decelerated. For example, when the distance between the measurement region 17 of the alignment detection unit 5 and the alignment mark 21 on the substrate is equal to or larger than a threshold, the control unit 9 moves the substrate stage 4 at a constant velocity (d-1). Then, the control unit 9 controls the focus measurement unit 6 to perform measurement at a measurement timing decided using equation (4) described above (to be referred to as a measurement timing at a constant velocity hereinafter) (e-1). When the distance between the measurement region 17 of the alignment detection unit 5 and the alignment mark 21 becomes equal to or smaller than the threshold, the control unit 9 decelerates the substrate stage 4 (d-2). Then, the control unit 9 controls the focus measurement unit 6 to perform measurement at a measurement timing decided using equation (2) described above (to be referred to as a measurement timing in acceleration/ deceleration hereinafter) (e-2). When the measurement region 17 of the alignment detection unit 5 is arranged on the alignment mark 21, the control unit 9 stops the substrate stage 4 (d-3), and controls the alignment detection unit 5 to measure the position of the alignment mark 21 (f-1). After the end of measurement by the alignment detection unit 5, the control unit 9 accelerates the substrate stage 4 (d-4), and controls the focus measurement unit 6 to perform measurement at the measurement timing in acceleration/deceleration (e-3). When the distance between the measurement region 17 of the alignment detection unit 5 and the alignment mark 21 on the substrate becomes equal to or larger than the threshold (d-5), the control unit 9 controls the focus measurement unit 6 to perform measurement at the measurement timing at a constant velocity (e-4). In this way, the control unit 9 stops the substrate stage 4 when the measurement region 17 of the alignment detection unit 5 is arranged on the alignment mark 21 on the substrate. Thus, when the distance between the measurement region 17 and the alignment mark 21 is equal to or smaller than the threshold, the substrate stage 4 is moved by accelerating or decelerating it. When the substrate stage 4 is accelerated or decelerated, the control unit 9 controls the focus measurement unit 6 to perform measurement at the measurement timing decided using equation (2) described above.

Figure 9:
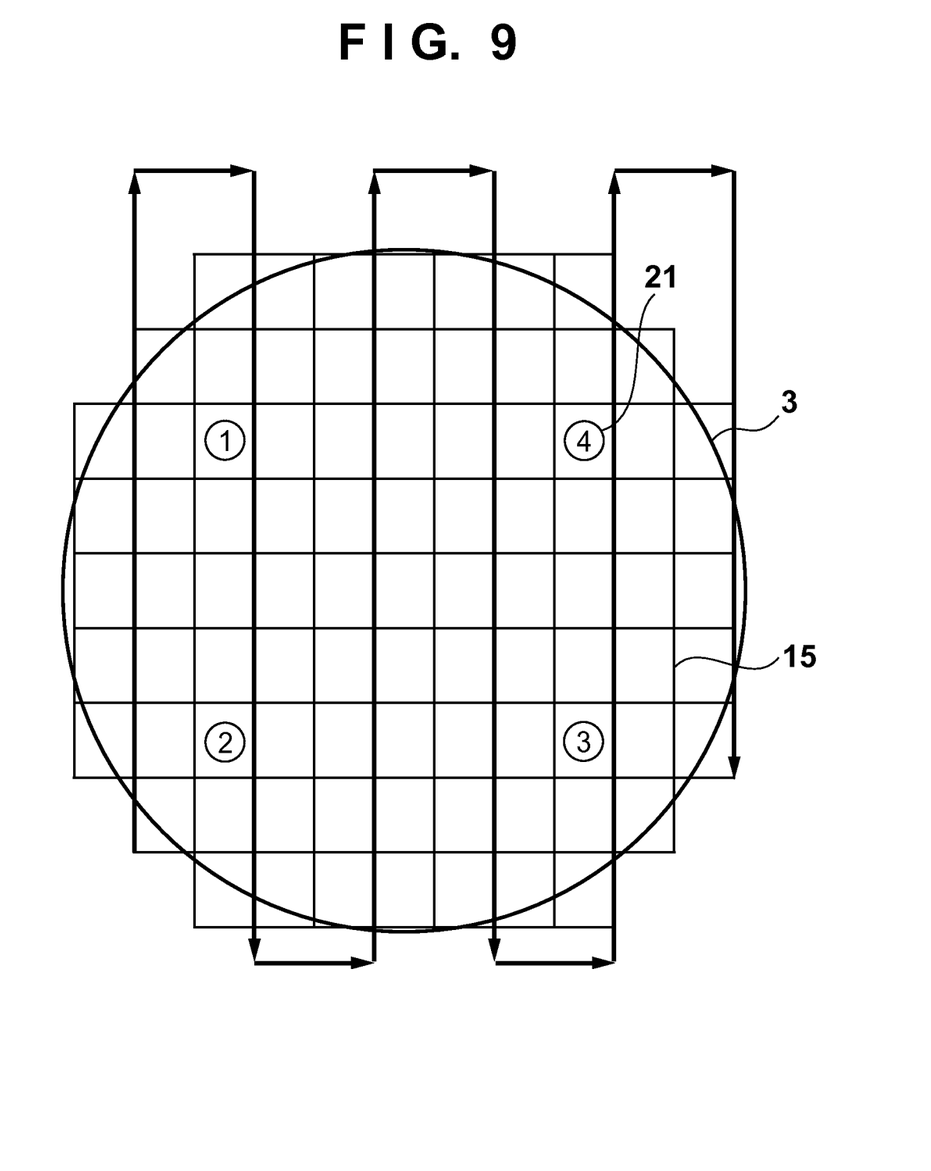
FIG. 9 is a view showing an example of the scanning path of the measurement region of the focus measurement unit and the arrangement position of an alignment mark.

FIG. 9 is a view showing an example of the scanning path of the measurement region 14 of the focus measurement unit 6 (measurement region 17 of the alignment detection unit 5) on the substrate, and the arrangement position of the alignment mark 21. In FIG. 9, arrows indicate the scanning paths of the measurement region 14 by the focus measurement unit, and circled 1 to circled 4 indicate the arrangement positions of the alignment marks 21. In the exposure apparatus 300 (measurement area) according to the third embodiment, the focus measurement unit 6 simultaneously performs focus measurement in the two shot regions 15 arranged side by side in the X direction, as shown in FIG. 9. As the measurement region 17 of the alignment detection unit 5 comes close to the alignment mark 21, the control unit 9 decelerates the substrate stage 4, and when the measurement region 17 is arranged on the alignment mark 21, stops the substrate stage 4. After the end of alignment measurement, the control unit 9 accelerates the substrate stage 4. As described above, the control unit 9 controls the focus measurement unit 6 at the measurement timings decided using equations (2) and (4). Thus, even in the state in which the substrate stage 4 is accelerated or decelerated, the focus measurement unit 6 can perform measurement to equally space a plurality of measurement portions. As a result, the exposure apparatus 300 according to the third embodiment can parallelly perform alignment measurement and focus measurement.

Figure 10:
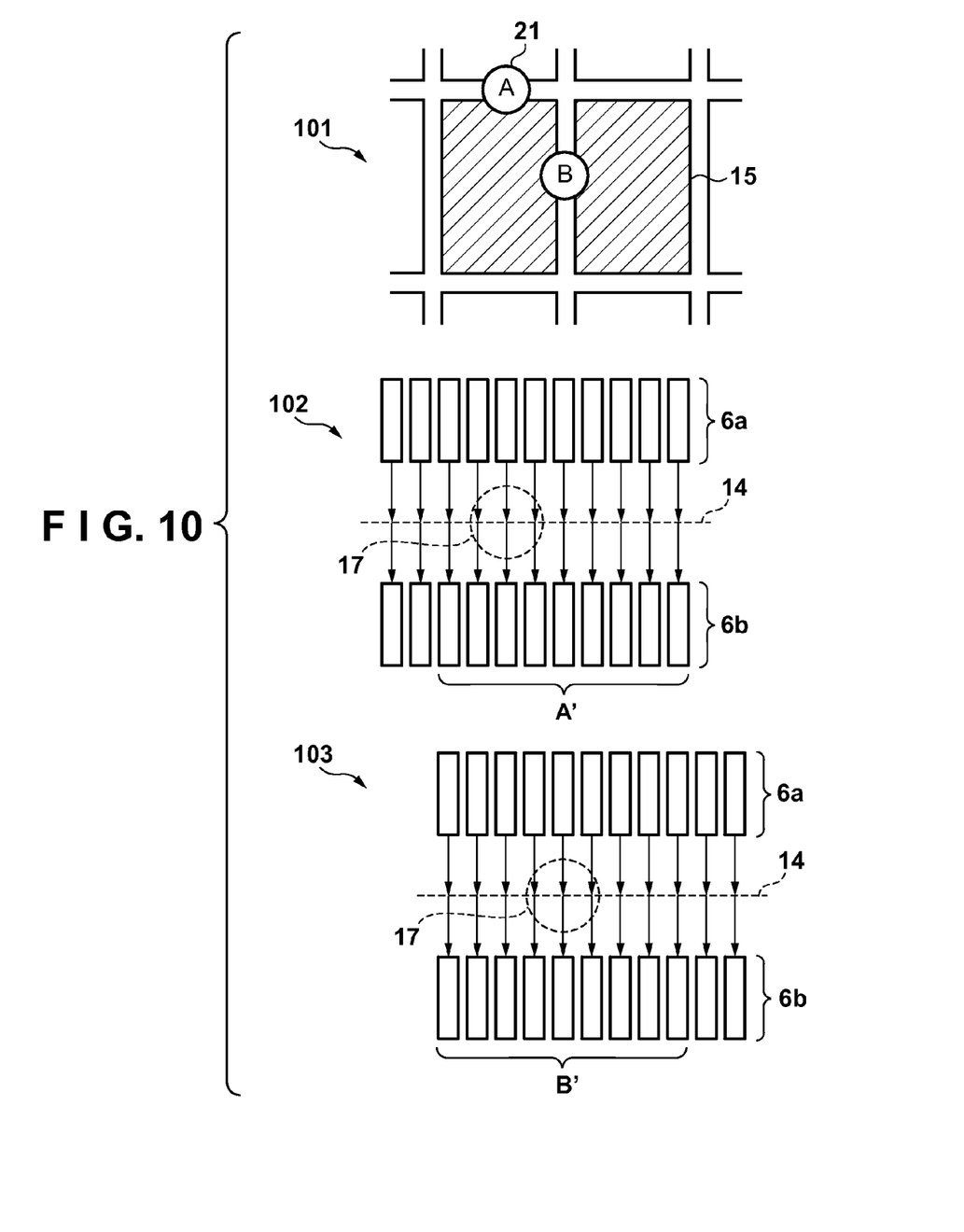
FIG. 10 is a view for explaining the measurement region of the focus measurement unit and the measurement region of the alignment detection unit.

The alignment mark 21 is arranged on the left side of the shot region 15 in FIG. 8, but is not limited to this. For example, when the focus measurement unit 6 simultaneously performs measurement in the two shot regions 15 arranged side by side in the X direction, the alignment marks 21 are sometimes arranged at, for example, positions A and B, as represented by 101 in FIG. 10. The position where the alignment mark 21 is arranged can be decided by, for example, the design of a semiconductor device. The numbers of irradiation units 6a and light receiving units 6b in the focus measurement unit 6 may be increased in the X direction so that the irradiation unit 6a and light receiving unit 6b to be used for focus measurement can be selected in accordance with the position where the alignment mark 21 is arranged. For example, when the alignment mark 21 is arranged at the position A, as represented by 101 in FIG. 10, focus measurement is performed using the irradiation units 6a and light receiving units 6b arranged at a portion A' in the focus measurement unit 6, as represented by 102 in FIG. 10. When the alignment mark 21 is arranged at the position B, as represented by 101 in FIG. 10, focus measurement is performed using the irradiation units 6a and light receiving units 6b arranged at a portion B' in the focus measurement unit 6, as represented by 103 in FIG. 10. At this time, the relative positions of the alignment detection unit 5 and focus measurement unit 6 remain unchanged in 102 and 103 of FIG. 10. The control unit 9 selects the irradiation unit 6a and light receiving unit 6b used for focus measurement by changing the relative positions of the substrate stage 4 and focus measurement unit 6 (alignment detection unit 5) in accordance with the position of the alignment mark 21.

<Embodiment of Method of Manufacturing Article>

A method of manufacturing an article according to the embodiment of the present invention is suitable for manufacturing an article such as a microdevice (for example, a semiconductor device) or an element having a microstructure. The method of manufacturing an article according to the embodiment can include a step of forming a latent image pattern on a photosensitive agent applied to a substrate by using the above-described scanning exposure apparatus (a step of exposing a substrate), and a step of developing the substrate on which the latent image pattern is formed. Further, this manufacturing method includes other well-known steps (for example, oxidization, deposition, vapor deposition, doping, planarization, etching, resist removal, dicing, bonding, and packaging). The method of manufacturing an article according to the embodiment is superior to a conventional method in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-104514 filed on May 16, 2013, which is hereby incorporated by reference herein in its entirety.

What is claimed is:

1. An exposure apparatus which exposes a substrate, comprising:
   a substrate stage configured to be movable while holding the substrate;
   a measurement unit configured to measure a height of the substrate by irradiating the substrate with light and detecting the light reflected by the substrate; and
   a control unit configured to control the measurement unit,
   wherein the control unit obtains a velocity profile of the substrate stage and decides, based on the velocity profile, a plurality of timings to perform measurement by the measurement unit to equally space a plurality of measurement portions on the substrate measured by the measurement unit in a state in which an acceleration of the substrate stage is nonzero.

2. The apparatus according to claim 1, wherein
   the measurement unit performs measurement in a period at each of the plurality of timings to give a range to each of the plurality of measurement portions, and
   the control unit decides the period at each of the plurality of timings based on the velocity profile to set, to be a target value, a length of the range of each of the plurality of measurement portions in a moving direction of the substrate stage.

3. The apparatus according to claim 2, wherein the measurement unit sets, as a measurement result at one measurement portion, an average value of a height at the one measurement portion.

4. The apparatus according to claim 2, wherein the control unit changes, in accordance with the decided period, an intensity of light irradiating the range by the measurement unit so that an irradiating dose of light irradiating the range by the measurement unit falls within an allowable range.

5. The apparatus according to claim 1, wherein
the measurement unit measures a height of a region of the substrate irradiated with light for exposing the substrate, prior to the irradiation in a state in which the substrate moves according to the velocity profile, and
the control unit decides the plurality of timings based on the velocity profile when exposing the substrate.

6. The apparatus according to claim 1, further comprising a detection unit configured to detect an alignment mark formed on the substrate,
wherein the control unit decides the plurality of timings based on the velocity profile when the detection unit detects the alignment mark.

7. The apparatus according to claim 1, further comprising a position measurement unit configured to measure a position of the substrate stage,
wherein the control unit obtains the velocity profile by using a measurement result of the position measurement unit.

8. A method of manufacturing an article, the method comprising:
exposing a substrate using an exposure apparatus;
developing the exposed substrate; and
processing the developed substrate to manufacture the article,
wherein the exposure apparatus, which exposes the substrate, includes:
a substrate stage configured to be movable while holding the substrate;
a measurement unit configured to measure a height of the substrate by irradiating the substrate with light and detecting the light reflected by the substrate; and
a control unit configured to control the measurement unit,
wherein the control unit obtains a velocity profile of the substrate stage and decides, based on the velocity profile, a plurality of timings to perform measurement by the measurement unit to equally space a plurality of measurement portions on the substrate measured by the measurement unit in a state in which an acceleration of the substrate stage is nonzero.

9. An exposure apparatus which exposes a substrate, comprising:
a substrate stage configured to be movable while holding the substrate;
a measurement unit configured to measure a height of the substrate by irradiating the substrate with light and detecting the light reflected by the substrate; and
a control unit configured to control the measurement unit,
wherein the control unit performs measurement by the measurement unit in a state in which an acceleration of the substrate stage is nonzero, and wherein the control unit obtains a velocity profile of the substrate stage and decides, based on the velocity profile, a plurality of timings to perform the measurement by the measurement unit so that a interval of the plurality of timings in a state in which velocity of the substrate stage is high becomes shorter than the interval of the plurality of timings in a state in which the velocity of the substrate stage is low.

* * * * *